United States Patent
Frenila et al.

(10) Patent No.: US 10,340,700 B2
(45) Date of Patent: Jul. 2, 2019

(54) POWER REGULATION SYSTEM FOR ENERGY HARVESTERS

(71) Applicant: Analog Devices Global, Hamilton (BM)

(72) Inventors: Junifer Frenila, Cavite (PH); Perryl Glo Angac, Cavite (PH); Oliver Silvela, Jr., Cavite (PH)

(73) Assignee: Analog Devices Global, Hamilton (BM)

( * ) Notice: Subject to any disclaimer, the term of this patent is extended or adjusted under 35 U.S.C. 154(b) by 222 days.

(21) Appl. No.: 15/224,071

(22) Filed: Jul. 29, 2016

(65) Prior Publication Data

US 2018/0034279 A1 Feb. 1, 2018

(51) Int. Cl.
| | | |
|---|---|---|
| H02J 3/38 | (2006.01) | |
| H03M 1/12 | (2006.01) | |
| G01R 21/00 | (2006.01) | |
| H02J 50/00 | (2016.01) | |

(52) U.S. Cl.
CPC ............ *H02J 3/383* (2013.01); *G01R 21/00* (2013.01); *H02J 3/386* (2013.01); *H02J 50/00* (2016.02); *H03M 1/12* (2013.01); *G08C 2201/11* (2013.01)

(58) Field of Classification Search
CPC .......... G01R 21/00; H02J 3/383; H02J 50/00; H03M 1/12; G08C 2201/11
See application file for complete search history.

(56) References Cited

U.S. PATENT DOCUMENTS

| | | |
|---|---|---|
| 7,081,693 B2 | 7/2006 | Hamel et al. |
| 7,834,483 B2 | 11/2010 | Kearney-Fischer et al. |
| 8,769,315 B1 | 7/2014 | Ortiz et al. |
| 9,197,143 B1 | 11/2015 | Townsend et al. |
| 9,232,475 B2 | 1/2016 | Heinzelman et al. |

(Continued)

FOREIGN PATENT DOCUMENTS

| | | | |
|---|---|---|---|
| CN | 202363945 U | 8/2012 | |
| CN | 203466601 U | 3/2014 | |

(Continued)

OTHER PUBLICATIONS

International Search Report and Written Opinion dated Nov. 24, 2017 in connection with International Application No. PCT/IB2017/001084.

(Continued)

*Primary Examiner* — Jared Fureman
*Assistant Examiner* — Duc M Pham
(74) *Attorney, Agent, or Firm* — Wolf, Greenfield & Sacks, P.C.

(57) ABSTRACT

According to some aspects, a power regulation system for energy harvesters that lacks a battery is provided. In some embodiments, the power regulation system may receive power from multiple energy harvesters that generate energy from different sources, such as wind currents and ambient light. In these embodiments, the power regulation system may selectively provide power from one or more of the energy harvesters to a load as environmental conditions change and power itself with energy from the energy harvesters. Thereby, the power regulation system may start and operate without a battery and provide power to the load over a wider range of environmental conditions.

20 Claims, 8 Drawing Sheets

(56) References Cited

U.S. PATENT DOCUMENTS

| | | | |
|---|---|---|---|
| 2006/0281435 A1* | 12/2006 | Shearer | G06K 19/0707 455/343.1 |
| 2013/0324059 A1* | 12/2013 | Lee | H04W 52/02 455/127.1 |
| 2013/0336185 A1 | 12/2013 | Yang et al. | |
| 2014/0036877 A1 | 2/2014 | Campbell et al. | |
| 2014/0175880 A1 | 6/2014 | Miyanaga et al. | |
| 2014/0183947 A1 | 7/2014 | Chandler et al. | |
| 2015/0222964 A1 | 8/2015 | Hernon et al. | |
| 2016/0007525 A1 | 1/2016 | Drew et al. | |

FOREIGN PATENT DOCUMENTS

| | | |
|---|---|---|
| GB | 2 527 312 A | 12/2015 |
| KR | 101457436 B1 | 11/2014 |
| WO | WO 2010/093234 A2 | 8/2010 |

OTHER PUBLICATIONS

Chalasani et al., A survey of energy harvesting sources for embedded systems. Southeastcon, 2008. IEEE. Apr. 3-6, 2008;442-7.

Seah et al., Wireless sensor networks powered by ambient energy harvesting (WSN-HEAP)—Survey and challenges. Wireless Communication, Vehicular Technology, Information Theory and Aerospace & Electronic Systems Technology, 2009. $1^{st}$ International Conference on Wireless VITAE 2009. IEEE. 2009;1-5.

Stojčev et al., Power management and energy harvesting techniques for wireless sensor nodes. Telecommunication in Modern Satellite, Cable, and Broadcasting Services, 2009. $9^{th}$ International Conference on TELSIKS '09, Serbi, Niš. IEEE. Oct. 7-9, 2009;65-72.

International Preliminary Report on Patentability dated Jan. 29, 2019 in connection with International Application No. PCT/IB2017/001084.

* cited by examiner

POWER REGULATION SYSTEM FOR ENERGY HARVESTERS

FIELD OF THE DISCLOSURE

The present disclosure relates to power regulation systems for energy harvesters that lack a battery.

BACKGROUND

An energy harvester generates electrical energy from environmental sources such as ambient light, wind currents, and heat. Power regulation systems may use the power received from an energy harvester to charge a battery that, in turn, provides power to an electronic device. Alternatively, power regulation systems may use the power received from an energy harvester to supplement power from a battery to reduce the drain on the battery and, thereby, extend the lifespan of the battery.

SUMMARY OF THE DISCLOSURE

According to some aspects, a power regulation system for energy harvesters that lacks a battery is provided. In some embodiments, the power regulation system may receive power from multiple energy harvesters that generate energy from different sources, such as wind currents and ambient light. In these embodiments, the power regulation system may selectively provide power from one or more of the energy harvesters to a load as environmental conditions change and power itself with energy from the energy harvesters. Thereby, the power regulation system may start and operate without a battery and provide power to the load over a wider range of environmental conditions.

According to at least one aspect, a wireless node is provided. The wireless node includes a sensor configured to generate information indicative of at least one parameter, a wireless transmitter coupled to the sensor and configured to wirelessly transmit the information indicative of the at least one parameter, a plurality of energy harvesters including a first energy harvester, a first regulator coupled to the first energy harvester and configured to receive power from the first energy harvester, and a second regulator coupled to the plurality of energy harvesters and the first regulator. The second regulator may be configured to selectively receive power from the first regulator and at least one of the plurality of energy harvesters and provide power to the wireless transmitter.

According to at least one aspect, a power regulator system is provided. The power regulation system includes a plurality of power ports configured to couple to a plurality of energy harvesters, the plurality of power ports including a first power port configured to couple to a first energy harvester of the plurality of energy harvesters, a first regulator coupled to the first power port and configured to receive power from the first energy harvester, and a second regulator coupled to the first regulator and the plurality of power ports. The second regulator may be configured to selectively receive power from the first regulator and at least one of the plurality of energy harvesters and provide power to a load.

According to at least one aspect, a method of operating a wireless node is provided. The method includes receiving power from a first energy harvester of a plurality of energy harvesters, providing, by a first regulator, the power from the first energy harvester to a controller via a second regulator, measuring an output power of each of the plurality of energy harvesters, identifying, by the controller, an energy harvester from the plurality of energy harvesters to power the controller based on the output power of each of the plurality of energy harvesters, and controlling, by the controller, a plurality of switches to couple the identified energy harvester to the second regulator and decouple a remainder of the energy harvesters from the second regulator.

BRIEF DESCRIPTION OF THE DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

According to some aspects, wireless nodes are provided including multiple energy harvesters of different types to power the node instead of a battery, together with a power regulation system regulating the power generated by the energy harvesters. The inventors have appreciated that devices powered by energy harvesters, such as wireless sensor nodes, are typically placed in remote locations that are challenging for maintenance personnel to reach. Further, the inventors have appreciated that the battery in these devices may need periodic replacement or other maintenance, limiting the lifetime and usefulness of such devices. Accordingly, aspects of the present disclosure are directed to power regulation systems that provide power from energy harvesters without a battery. Thereby, the maintenance requirements of the power regulation system are reduced (or eliminated), which may extend the lifetime and usefulness of wireless sensor nodes or other devices incorporating such power regulation systems.

The power regulation system may receive power from multiple types of energy harvesters that generate energy from different sources, such as wind currents and ambient light, and selectively provide power from one or more of the energy harvesters to a load, such as a sensor. For example, the power regulation system may dynamically switch between receiving power from a solar panel and a thermoelectric generator to power the load as the environmental conditions change. Thus, the power regulation system can provide power to the load over a wider range of environmental conditions and reduce the frequency and/or duration of dropout periods where one or more of the energy harvesters is not providing sufficient energy to power the load.

In some embodiments, the power regulation system operates in a feedback loop where the power regulation system monitors the output power of each energy harvester, identifies the appropriate energy harvester(s) to couple to a main regulator based on the output power of each energy harvester, selectively couples the identified energy harvester(s) to the main regulator via switches, and provides power to the load and the circuitry within the power regulation system via the main regulator. In these embodiments, the feedback loop may receive power from another component within the power regulation system to begin operation. For example, the power regulation system may include another regulator (e.g., a startup regulator) that is directly coupled to one of the energy harvesters and bypasses the switches that selectively couple the energy harvesters to the main regulator. Thereby, the startup regulator can receive power from one of the energy harvesters regardless of the state of the switches and provide power to the main regulator during startup. Accordingly, the operation of the feedback loop may begin and quickly recover from any dropout periods without a battery.

Figure 1A:
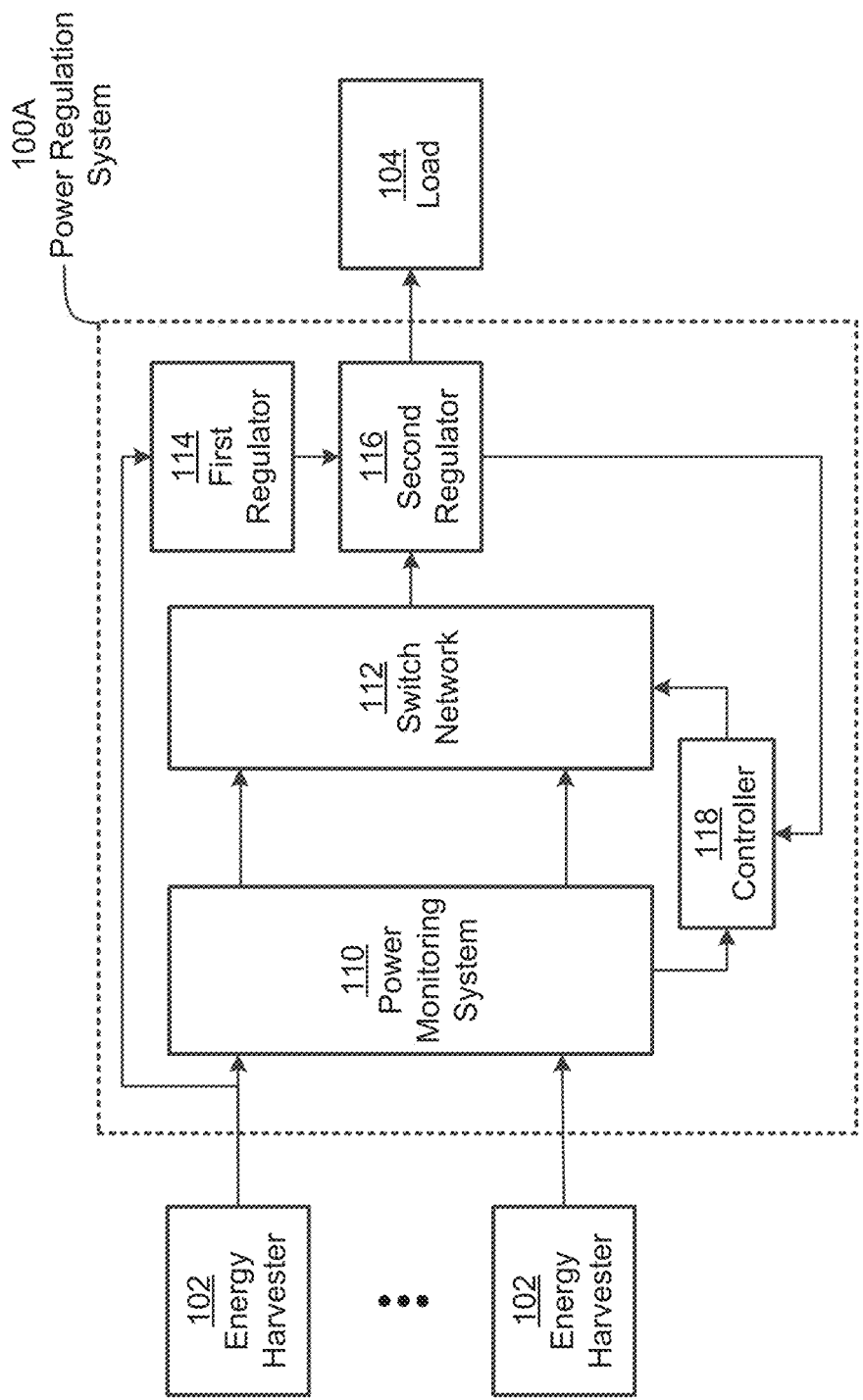
FIGS. 1A-1C each show an example power regulation system configured to receive power from energy harvesters and provide power to a load, according to some embodiments.

FIG. 1A shows an example power regulation system 100A, according to some embodiments, and which may be used in a wireless node as described below in connection with FIG. 2. The power regulation system 100A receives power from energy harvesters 102 and converts the power into a suitable form for the load 104. For example, the voltage provided by the energy harvesters 102 may vary over the course of a day as environmental conditions change. In this example, the power regulation system 100A may convert the varying output voltage of the energy harvesters 102 into a constant (or substantially constant) output voltage that is suitable to power the load 104 via multiple regulators. As shown, the power regulation system 100A includes power monitoring system 110, a switch network 112, a first regulator 114 (e.g., a startup regulator), a second regulator 116 (e.g., a main regulator), and a controller 118.

The energy harvesters 102 may generate electrical energy from various environmental conditions and provide the generated electrical energy to the power regulation system 100A. For example, the energy harvester 102 may be configured to convert light, wind currents, and/or heat into electrical energy. The energy harvesters 102 may be microfabricated devices such as a microfabricated photovoltaic device, a microfabricated thermoelectric device, and/or a microfabricated vibrational energy harvester. In some embodiments, each of the energy harvesters 102 that are coupled to the power regulation system 100A may generate electrical energy from different environmental sources. For example, the power regulation system 100A may be coupled to a first energy harvester that is a photovoltaic device, a second energy harvester that is a wind turbine, and a third energy harvester that is a thermoelectric generator. Thereby, the possibility that electrical energy output of all of the energy harvesters 102 is simultaneously zero (or near zero) is reduced. In other embodiments, two or more of the energy harvesters 102 may harvest energy from the same environment source, such as ambient light, and be placed in different locations. Accordingly, it should be appreciated that any number and type of energy harvesters may be employed as energy harvesters 102.

The load 104 may receive power from the power regulation system 100A. The load 104 may be any of a variety of electrical devices that consume power. In some embodiments, the load 104 may include various components within a wireless node that is configured to gather information from a sensor and wirelessly transmit the information to another device, such as a central computer system. For example, the load 104 may include a wireless transmitter, a wireless receiver, a microcontroller, and/or a sensor, such as a pressure sensor, strain sensor, motion sensor, acceleration sensor, or other type of sensor.

As discussed above, the output of the energy harvesters 102 may vary over the course of a day or other relevant time period. For example, the energy harvesters 102 may include a wind turbine and a photovoltaic device. In this example, the photovoltaic device may have a peak output power during the day and the wind turbine may have a peak output power at night. In some embodiments, the power regulation system 100A may monitor the output power of the energy harvesters 102 via the power monitoring system 110 and selectively couple one or more of the energy harvesters 102 with the highest output power to the second regulator 116 via the switch network 112. The controller 118 may perform the output power comparison based on information from the power monitoring system 110 and send control signals to the switch network 112 to control which energy harvester(s) 102 are coupled to the second regulator 116. In turn, the second regulator 116 may convert the power from the selected energy harvester(s) 102 into a suitable form for the load 104. The first regulator 114 may bypass the switch network 112 and receive power directly from one of the energy harvesters 102 to provide power to the second regulator 116 during, for example, startup of the power regulation system 100A where none of the energy harvesters 102 may be coupled to the second regulator 116 via the switch network 112.

The power monitoring system 110 may monitor an output power of each of the energy harvesters 102 and provide information indicative of the output power to the controller 118. For example, the power monitoring system 110 may monitor an output current of the energy harvesters 102 and provide a signal indicative of the output current to the controller 118. In other examples, the power monitoring system 110 may monitor an output voltage of the energy harvesters 102 and provide a signal indicative of the output voltage to the controller 118. In still yet other examples, the power monitoring system 110 may monitor a magnitude of current through an impedance coupled in series with the output of the energy harvesters 102 and provide a signal indicative of the magnitude of current to the controller 118.

The switch network 112 may selectively couple one or more of the energy harvesters 102 to the second regulator 116 based on control signals from the controller 118. For example, the switch network may receive a control signal indicating which energy harvester 102 to couple to the second regulator 116. In this example, the switch network 112 may couple the identified energy harvester 102 to the second regulator 116 and decouple the remaining energy harvesters 102 from the second regulator 116.

The controller 118 may control operation of the switch network 112 based on information received by the power monitoring system 110. The controller 118 may be implemented as, for example, a microcontroller or other suitable processing device. In some embodiments, the controller 118 may receive voltage signals indicative of the output power of each of the energy harvesters 102 from the power monitoring system 110, identify the energy harvester 102 with the highest output power, and send control signals to the switch network 112 to couple the identified energy harvester to the second regulator 116. In these embodiments, the controller 118 may read the voltage signals from the power monitoring system 110 periodically (e.g., every minute) to re-evaluate the appropriate energy harvester 102 to couple to the second regulator 116. It should be appreciated that the controller 118 may use other methods to identify the appropriate energy harvester 102 to couple to the second regulator 116. For example, the controller 118 may identify trends in the output power of the energy harvesters 102 and identify the energy harvester 102 that has an output power that is above a minimum threshold and has an increasing trajectory.

The first regulator 114 may be a voltage regulator and/or a boost regulator configured to receive an input voltage from one of the energy harvesters 102 and provide a regulated voltage to the second regulator 116. For example, the voltage provided by the energy harvester 102 may vary over a range, such as between 80 millivolts and 3.3 volts. In this example, the first regulator 114 may provide a constant (or substantially constant) output voltage to the second regulator 116, such as 3.3 volts. An example regulator that may be suitable to use as first regulator 114 is the ultralow power boost regulator ADP5090 manufactured by ANALOG DEVICES of Norwood, Massachusetts.

As shown in power regulation system 100A, the input of the first regulator 114 is directly coupled to one of the energy harvesters 102 and bypasses the power monitors 110 and the load switches 112. The direct connection to one of the energy harvesters allows the first regulator 114 to receive power from one of the energy harvesters 102 regardless of the state of the load switches 112. The first regulator 114 may be connected to the energy harvester 102 that is most likely to generate power. For example, the power regulation system 100A may be integrated into a wireless node placed on a windy bridge with minimal temperature variation. In this example, the first regulator 114 may be directly connected to an energy harvester 102 that generates energy from the wind and not connected to another energy harvester that generates energy from heat or temperature variations.

The second regulator 116 may be a voltage regulator and/or a boost regulator configured to receive an input voltage from one of the energy harvesters 102 or the first regulator 114 and provide a regulated voltage to the load 104. In some embodiments, the second regulator 116 may preferentially provide power to the load 104 based on power received from one or more energy harvester 102 coupled to the second regulator 116 via the switch network 112. In cases where the second regulator 116 is not receiving power from the energy harvesters 102, the second regulator 116 may provide power to the load 104 based on power received from the first regulator 114. In one example for illustration, the power regulation system 100A may be off and the switch network 112 may be in a state where none of the energy harvesters 102 are coupled to the second regulator 116. The energy harvesters 102 may start to generate energy and the first regulator 114 may turn on and provide power to the second regulator 116. The second regulator 116 may only be receiving power from the first regulator 114 at this time because the energy harvesters 102 are decoupled from the second regulator 116 by the switch network 112. Thereby, the second regulator 116 may provide power to the load 104 based on the power received from the first regulator 114. The second regulator 116 may also provide power to various components in the power regulation system 100A, such as the controller 118, to begin the process of monitoring the output power of the energy harvester 102 and selectively coupling one or more of the energy harvesters 102 to the second regulator 116 via the switch network 112. Once the switch network 112 has coupled one or more of the energy harvesters 102 to the second regulator 116, the second regulator 116 may begin providing power to the load 104 based on power received from the energy harvesters 102 via the switch network 112.

As discussed above, the first regulator 114 and the second regulator 116 may both regulate the output voltage of one or more energy harvesters 102 to generate an output voltage that is suitable for the load 104. In some embodiments, the first regulator 114 and the second regulator 116 may have the same construction to simplify manufacturing of the power regulation system 100A. For example, both the first regulator 114 and the second regulator 116 may be the ultralow power boost regulator ADP5090 manufactured by ANALOG DEVICES.

Figure 1B:
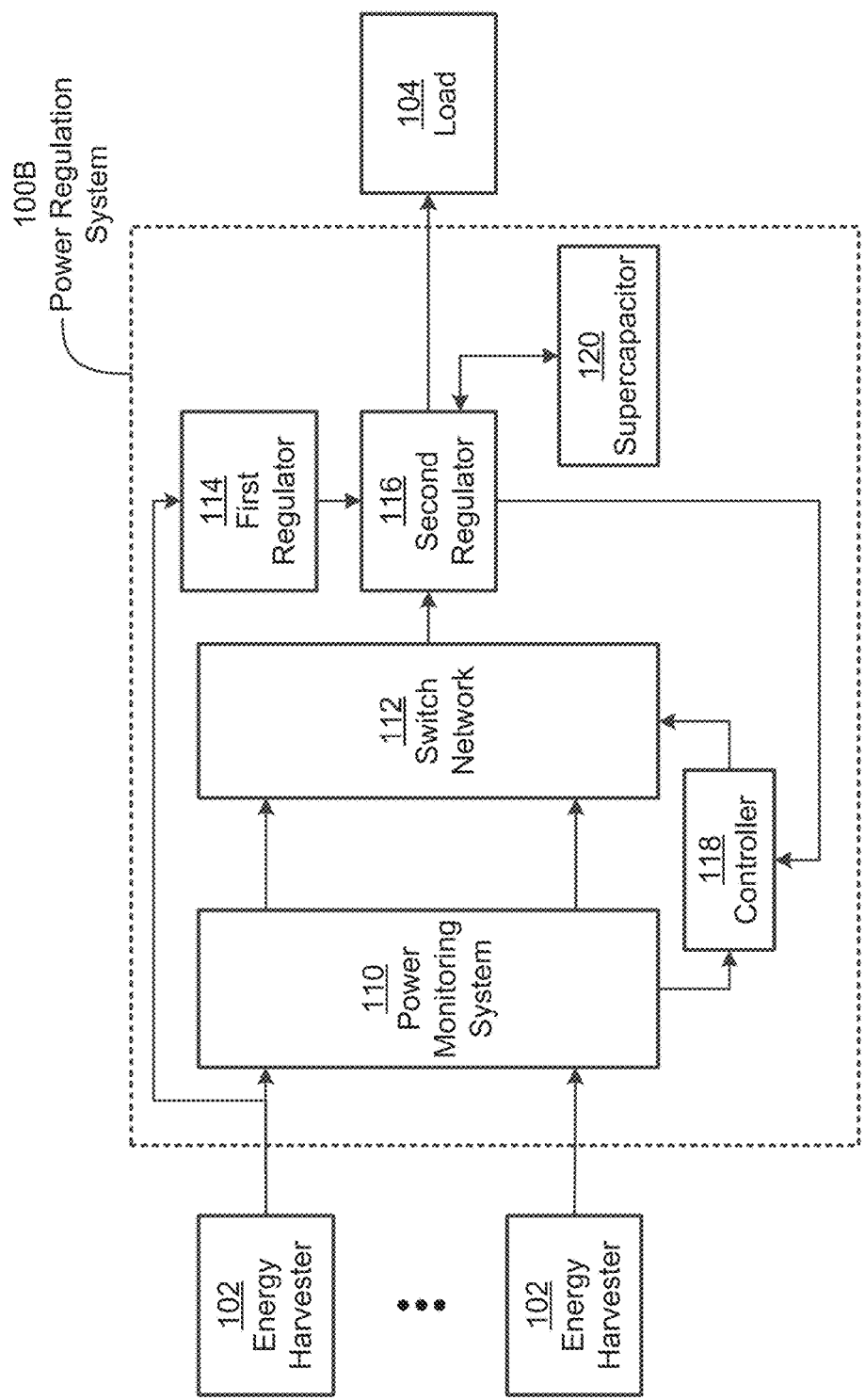

It should be appreciated that various alternations may be made to the power regulation system 100A without departing from the scope of the present disclosure. For example, the power regulation system 100A may be coupled to a load 104 that has varying power requirements, such as a transmitter. In some embodiments, the power regulation system 100A may further include a supercapacitor to store energy from the energy harvester 102 and provide energy to the load 104 during periods where the power demand of the load 104 exceeds the energy provided by the energy harvesters 102. An example of such a power regulation system is illustrated by power regulation system 100B in FIG. 1B. As shown, the power regulation system 100B adds a supercapacitor 120 coupled to the second regulator 116 relative to the power regulation system 100A shown in FIG. 1A.

The supercapacitor 120 may store electrical energy from one or more of the energy harvesters 102. For example, the second regulator 116 may charge the capacitor during periods where the power delivered to the load 104 is less than the power received from the energy harvester 102, such as during periods where the load 104 is off and/or in a low-power state. The second regulator 116 may discharge the supercapacitor 120 during periods where the power requirement of the load 104 has spiked, such as during periods where the load 104 is active. Thereby, the power regulation system 100B may support loads 104 with higher peak power requirements.

The super capacitor 120 may be constructed in any of a variety of fashions. In some embodiments, the supercapacitor 120 may comprise a substrate with a pair of electrodes on each side of an electrolyte material. The electrolyte material may be configured to store an electrical charge therein. Each electrode may be connected to a respective current collector, which may be formed from a conductive material such as gold, or a highly doped semiconductor, such as polysilicon. The electrodes may be formed from conventional materials known in the super-capacitor art, such as a porous solid material. For example, the electrodes may be formed from graphene, which is known to be a porous material with tortuous interior and exterior surfaces. The electrolyte material may be formed from any of a wide variety of materials. For example, the electrolyte material may be formed from an aqueous salt, such as sodium chloride, or a gel such as a polyvinyl alcohol polymer soaked in a salt. It should be appreciated that the electrolyte material may include an ionic liquid, in which ions are in the liquid state at room temperature, in some embodiments.

Figure 1C:
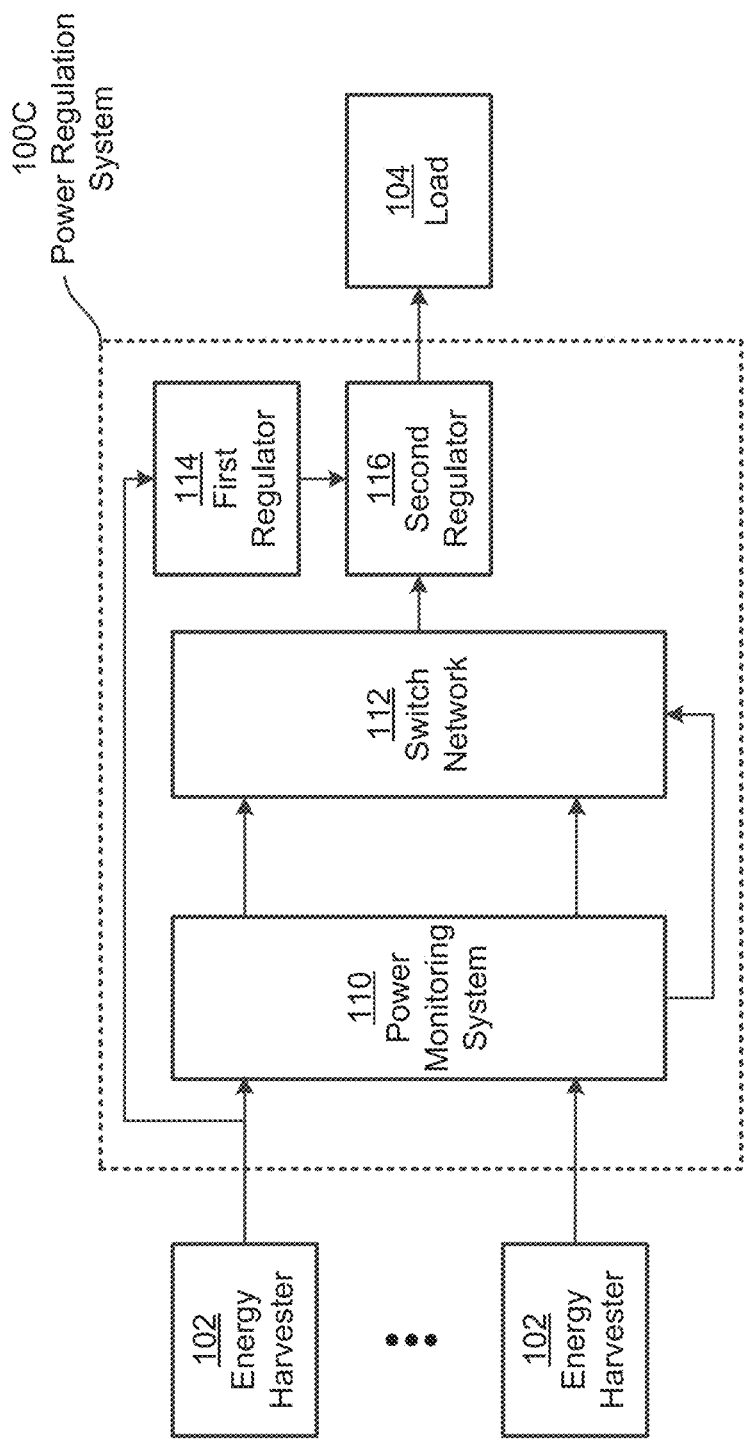

In some embodiments, the power regulation systems 100A and/or 100B may combine the functionality of one or more elements into a single element. For example, the load 104 may include a microcontroller and the functionality of the controller 118 may be integrated into the load 104. In another example, the functionality of the controller 118 may be performed by circuitry in the power monitoring system 110. An example of such a power regulation system is shown by power regulation system 100C in FIG. 1C. The power regulation system 100C omits the controller 118 relative to the power regulation system 100A shown above in FIG. 1A. In this implementation, the power monitoring system 110 includes circuitry to compare the output power of each of the energy harvesters 102 and send a control signal directly to the switch network 112. For example, the power monitoring system 106 may generate a voltage signal for each of the energy harvesters 102 coupled to the power regulation system 100C that is indicative of the output power of each energy harvester 102. In this example, the power monitoring system may include one or more comparators to compare the voltage signals and identify the energy harvester 102 with the highest output power. The power monitoring system 106 may, in turn, provide a control signal the switch network 112 based on the output of the comparators.

The power regulation systems 100A-100C may be used in any of a variety of devices that are powered by energy harvesters. For example, the power regulation systems 100A-100C may be employed in a wireless node that is configured to measure a particular parameter via a sensor and wirelessly transmit information indicative of the measured parameter to, for example, a central server or other computer system. Employing any of the power regulation systems 100A-100C may advantageously allow the wireless node to operate without a battery. An example of such a wireless node is illustrated by wireless node 200 in FIG. 2. As shown in FIG. 2, the wireless node includes energy harvesters 202, a power regulation system 204, a controller 206, a transmitter 208, a sensor 210, and an antenna 212.

The energy harvesters 202 may generate electrical energy that power the wireless node 200. The energy harvesters 202 may be similar (or the same) as the energy harvesters 102 described above with reference to FIG. 1. For example, the energy harvesters 202 may be solar panels, wind turbines, and/or thermoelectric generators. In some embodiments, the energy harvesters 202 may be microfabricated devices that are integrated into the wireless node 200 to form a self-contained and self-powered wireless node.

The power regulation system 204 may convert power from the energy harvesters 202 into energy suitable for various devices within the wireless node 200. For example, the power regulation system 104 may provide power to the controller 206 and/or the controller 208. The power regulation system 204 may be any of the power regulation systems 100A-100C described above.

The sensor 210 may be configured to measure a particular parameter and provide information indicative of the measured parameter to the controller 206. For example, the sensor 210 may be a strain gauge, a multi-axis accelerometer, or a thermocouple. It should be appreciated that multiple sensors 210 may be coupled to the controller 206. For example, the wireless node 200 may include a strain gauge and a multi-axis accelerometer coupled to the controller 206.

The controller 206 may gather information from the sensor 210 and provide the received information to the transmitter 208 for wireless transmission. For example, the sensor 210 may be a strain gauge and the controller 206 may read the strain gauge to determine a measurement value. In this example, the controller 206 may provide the measurement value to the transmitter 208 for wireless transmission via antenna 212. The controller 206 may also perform one or more functions for the power regulation system 204. For example, the power regulation system 204 may be the power regulation system 100A shown in FIG. 1A. In this example, the functionality of the controller 118 shown in FIG. 1A may be integrated into the controller 206. The controller 206 may be, for example, a microcontroller or other suitable processing device.

The transmitter 208 may receive information the controller 206 and wirelessly transmit the received information via the antenna 212. For example, the transmitter 208 may generate a baseband signal from the information received from the controller 206, modulate a carrier signal based on the baseband signal to generate a modulated signal, and wirelessly transmit the modulated signal via the antenna 212. In some embodiments, the transmitter 208 may be a transceiver that is configured to both transmit wireless signals and receive wireless signals. In these embodiments, the transceiver may be configured to receive wireless signals from another wireless node and repeat the information in the received wireless signals in a transmitted wireless signal. Thereby, wireless nodes that are out of range of a target destination device may transmit information to a nearby wireless node that may, in turn, transmit the information to the target destination device. For example, the transceiver may receive a wireless signal from another wireless node, extract information from the received wireless signal, and add the extracted information into a signal that is to be wirelessly transmitted.

It should be appreciated that the functionality of two or more of the components in wireless node 200 may be combined into a single component. For example, the functionality of the transmitter 208 may be integrated into the controller 206 to form a controller that is capable of transmitting and/or receiving wireless signals. Combining the functionality of the controller 206 and the transmitter 208 into a single device may advantageously reduce the power requirements of the wireless node 200. An example of such an integrated device is the precision analog microcontroller ARM cortex M3 with RF transceiver ADUCRF101 manufactured by ANALOG DEVICES.

Figure 3A:
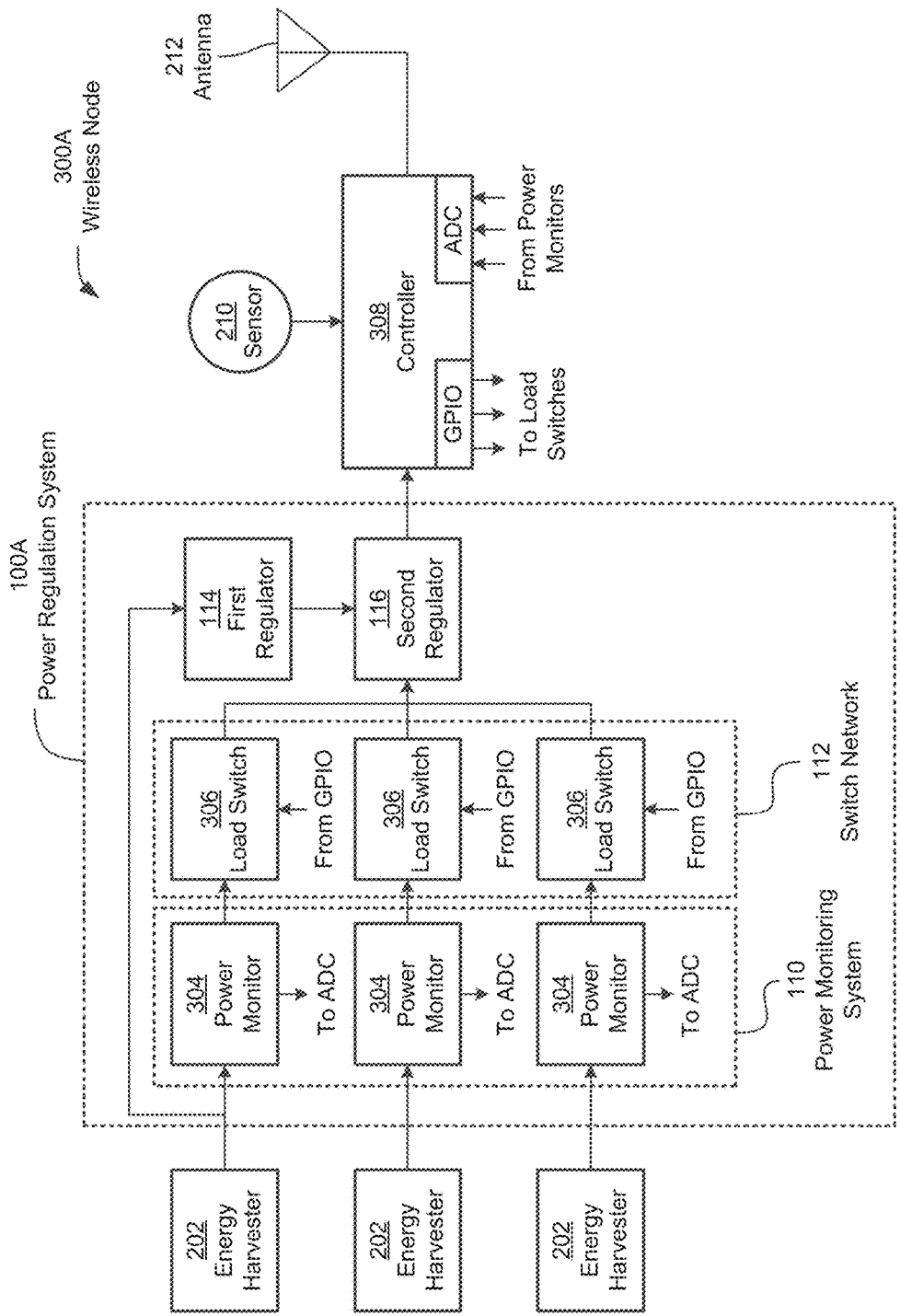
FIG. 3A is a diagram showing an example wireless node implementing the power regulation system shown in FIG. 1A, according to some embodiments.

As discussed above, the power regulation system 204 in the wireless node 200 may be implemented as the power regulation system 100A. An example of such an implementation of a wireless node is shown in FIG. 3A by wireless node 300A. As shown, the wireless node 300A generates power via energy harvesters 202 and converts the generated power into a suitable form for a controller 308 via the power regulation system 100A. The controller 308 reads the sensor 210 and wirelessly transmits the sensor information via antenna 212 in addition to controlling operation of the power regulation system 100A. The power regulation system 100A includes a power monitoring system 110 with power monitors 304, a switch network 112 with load switches 306, a first regulator 114, and a second regulator 116.

Figure 2:
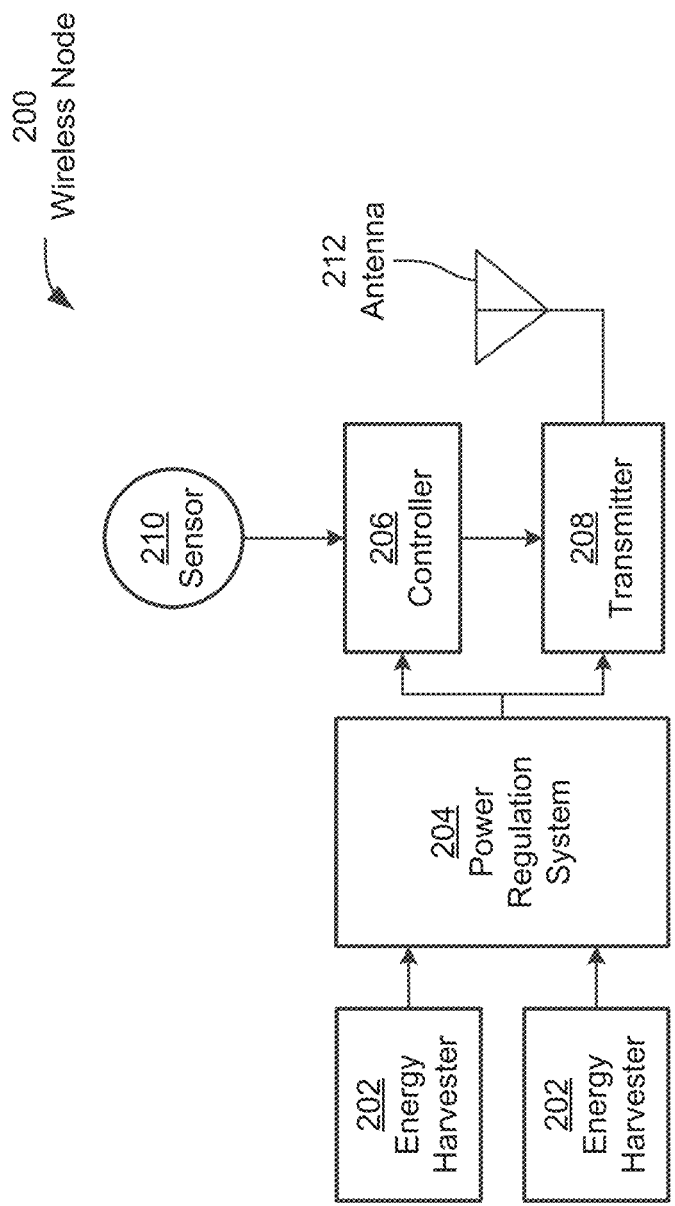
FIG. 2 is a diagram showing an example wireless node, according to some embodiments.

The controller 308 may be configured to perform the functions of multiple components previously shown in FIGS. 1A and 2. For example, the controller 308 may be configured to wirelessly communicate with external devices via antenna 212 and read information from the sensor 210. Thereby, the controller 308 may perform the functions of the controller 206 and the transmitter 208 shown in FIG. 2. Further, the controller 308 may be configured to read analog signals from the power monitoring system 110 via an analog-to-digital converter (ADC) and provide control signals to the switch network 112 via the general purpose input/output (GPIO) port. Thereby, the controller 308 may also perform the functions of the controller 118 shown in FIG. 1A. An example of a suitable device to employ as controller 308 includes the precision analog microcontroller ARM cortex M3 with RF transceiver ADUCRF101 manufactured by ANALOG DEVICES.

The power monitors 304 of the power monitoring system 110 may monitor an output power of the energy harvesters 202 and provide an analog signal to the ADC of the controller 308. In some embodiments, the power monitors 304 may include a current sense impendence coupled in series between the energy harvester 302 and the load switch 306. In this example, the power monitors 304 may measure a voltage difference across the terminals of the current sense impedance and provide an output voltage that is proportional to the voltage difference across the current sense resistor. A device that may be suitable to measure the voltage across the terminals of a current sense resistor and provide an output voltage indicative of the magnitude of the voltage difference across the current sense resistor includes the bidirectional current shunt monitor AD8210 manufactured by ANALOG DEVICES.

The load switches 306 of the switch network 112 may receive a signal from the GPIO of the controller 308 and selectively couple one of the energy harvesters 202 to the second regulator 116. In some embodiments, the load switches 306 may include a transistor coupled in series between the energy harvester 302 and the second regulator 116. In these embodiments, the load switches 306 may selectively couple the energy harvester 302 to the second regulator 116 by adjusting a gate voltage applied the transistor. For example, the transistor may be turned off to decouple the energy harvester 302 from the second regulator 116 by applying a voltage to the gate terminal of the transistor that is below the threshold voltage of the transistor. Conversely, the transistor may be turned on to couple the energy harvester 302 to the second regulator 116 by applying a voltage to the gate terminal of the transistor that is above the threshold voltage of the transistor. A load switch that may be suitable to use as load switch 306 includes the logic controlled high-side or low-side load switch ADP1196 manufactured by ANALOG DEVICES.

Figure 3B:
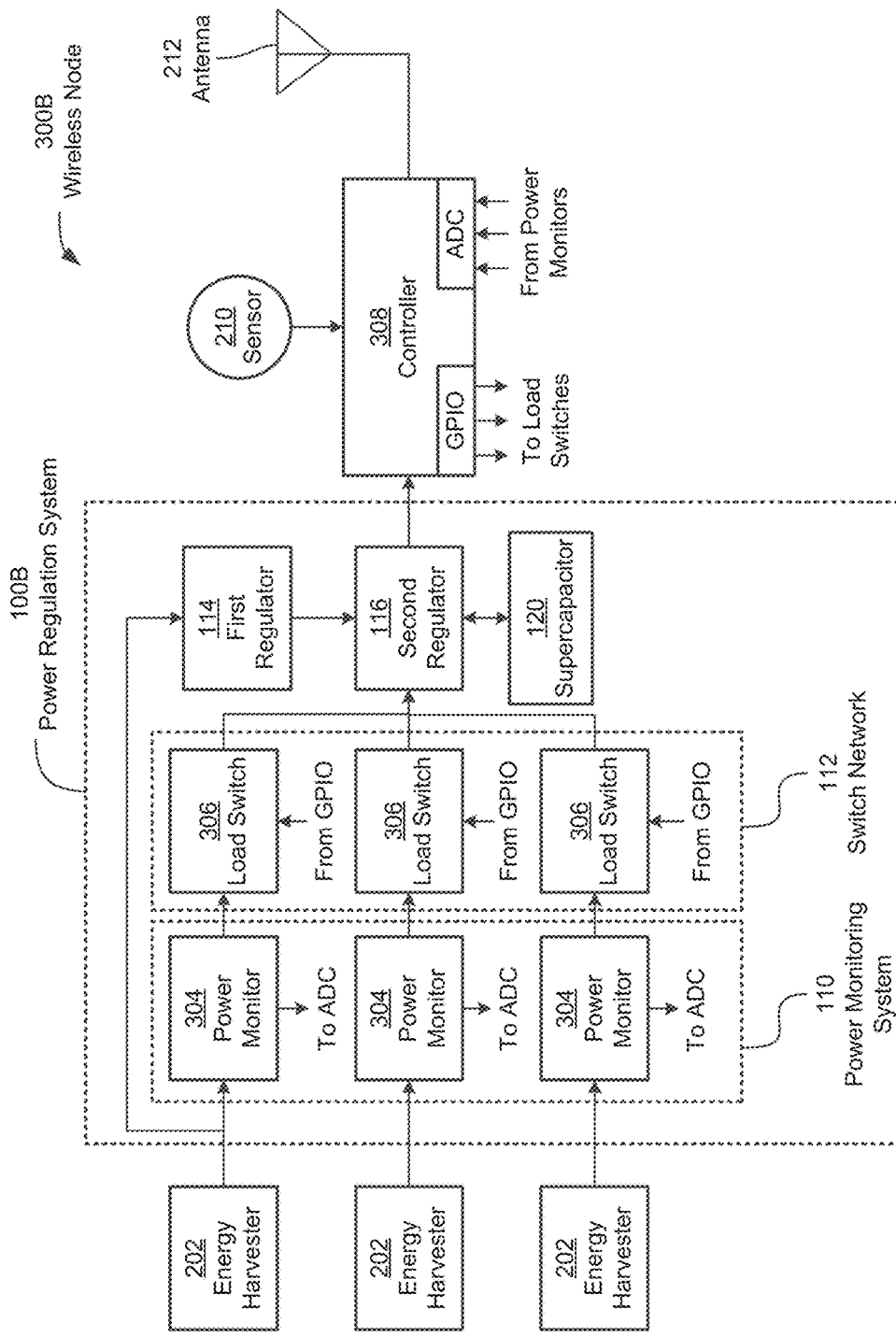
FIG. 3B is a diagram showing an example wireless node implementing the power regulation system shown in FIG. 1B, according to some embodiments.

It should be appreciated that the power regulation systems 100B and 100C may be implemented in a similar fashion in the wireless node 200. An example of such a wireless node implementing the power regulation system 100B is shown in FIG. 3B by the wireless node 300B. As shown, the wireless node 300B adds a super capacitor 120 coupled to the second regulator 116 relative to the wireless node 300A shown in FIG. 3A. The supercapacitor 120 may be charged by the second regulator 116 when the power generated by the energy harvesters 202 exceeds the power demand of the controller 308. Conversely, the supercapacitor 120 may be discharged when the power demand of the controller 308 exceeds the power provided by the energy harvesters 202, such as during wireless transmission.

Figure 4:
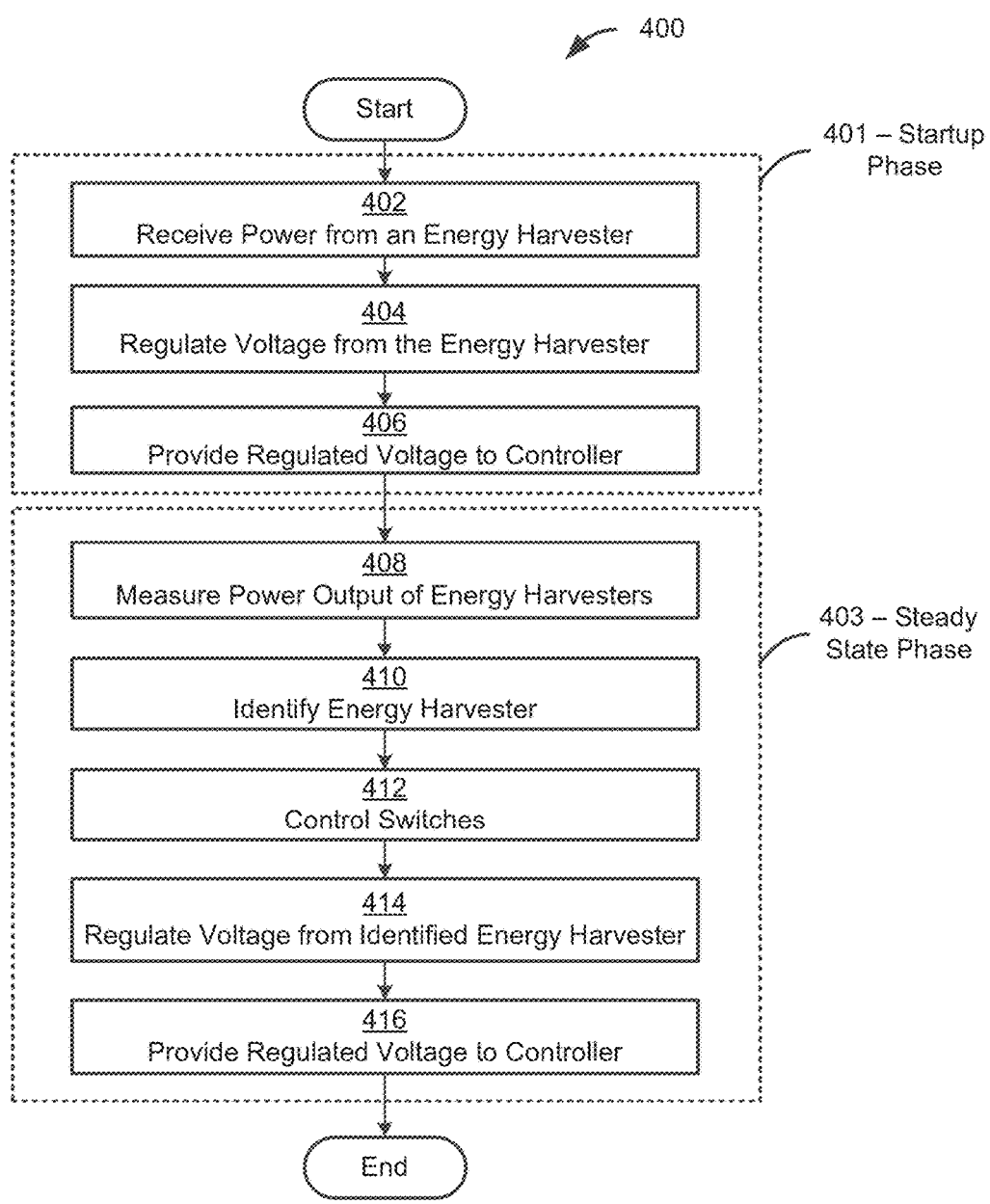
FIG. 4 is a flowchart showing an example method of operation for a power regulation system, according to some embodiments.

As discussed above, a power regulation system is disclosed herein that may be used in a variety of devices, such as wireless nodes, that are powered by energy harvesters. These power regulation systems may perform various processes during operation. An example of such a process of operation that may be performed by a power regulation system or a device employing the power regulation system, such as a wireless node, is illustrated by process 400 in FIG. 4. The process 400 has a startup phase including an act 402 of receiving power from the first energy harvester, an act 404 of regulating a voltage from the first energy harvester, and an act 406 of providing a regulated voltage to the controller. The process 400 has a steady state phase 403 including an act 408 of measuring the output power of the energy harvesters, an act 410 of identifying an energy harvester, an act 412 of controlling switches, an act 414 of regulating the output voltage of the identified energy harvesters, and an act 416 of providing the regulated voltage to the controller.

In act 402, the power regulation system may receive power from an energy harvester. For example, the first regulator 114 may be directly coupled to one of the energy harvesters, bypassing the switch network 112, and receive power from an energy harvester.

In act 404, the power regulation system may regulate the voltage from the energy harvester. For example, the first regulator 114 may regulate the output voltage of the energy harvester to generate a constant (or substantially constant) voltage.

In act 406, the power regulation system provides the regulated voltage to a controller. For example, the power regulation system may provide the regulated output voltage generated by the first regulator 114 to the controller 118 via the second regulator 116. Thereby, the controller 118 may begin operation and the startup phase 401 may end. It should be appreciated that the second regulator 116 may also provide power to a load, such as the load 104.

In act 408, the power regulation system may begin the steady state phase 403 by measuring the output power of energy harvesters. For example, the power regulation system may measure the output power of the energy harvesters via the power monitoring system 106.

In act 410, the power regulation system may identify the energy harvester to be coupled to the second regulator 116. For example, the controller 118 may identify the energy harvester with the highest output power based on information from the power monitoring system 106.

In act 412, the power regulation system may control the state of one or more switches to couple the identified energy harvester to the second regulator 116. For example, the controller 118 may send control signals to the switch network 112 to couple the identified energy harvester to the second regulator 116 and decouple the remaining energy harvesters from the second regulator 116.

In act 414, the power regulation system may regulate the output voltage of the identified energy harvester. For example, the second regulator 116 may generate a constant (or substantially constant) voltage based on the voltage from the identified energy harvester.

In act 416, the power regulation system may provide the regulated voltage to the controller. For example, the second regulator 116 may provide power to the controller 118 and/or the load 104.

Figure 5:
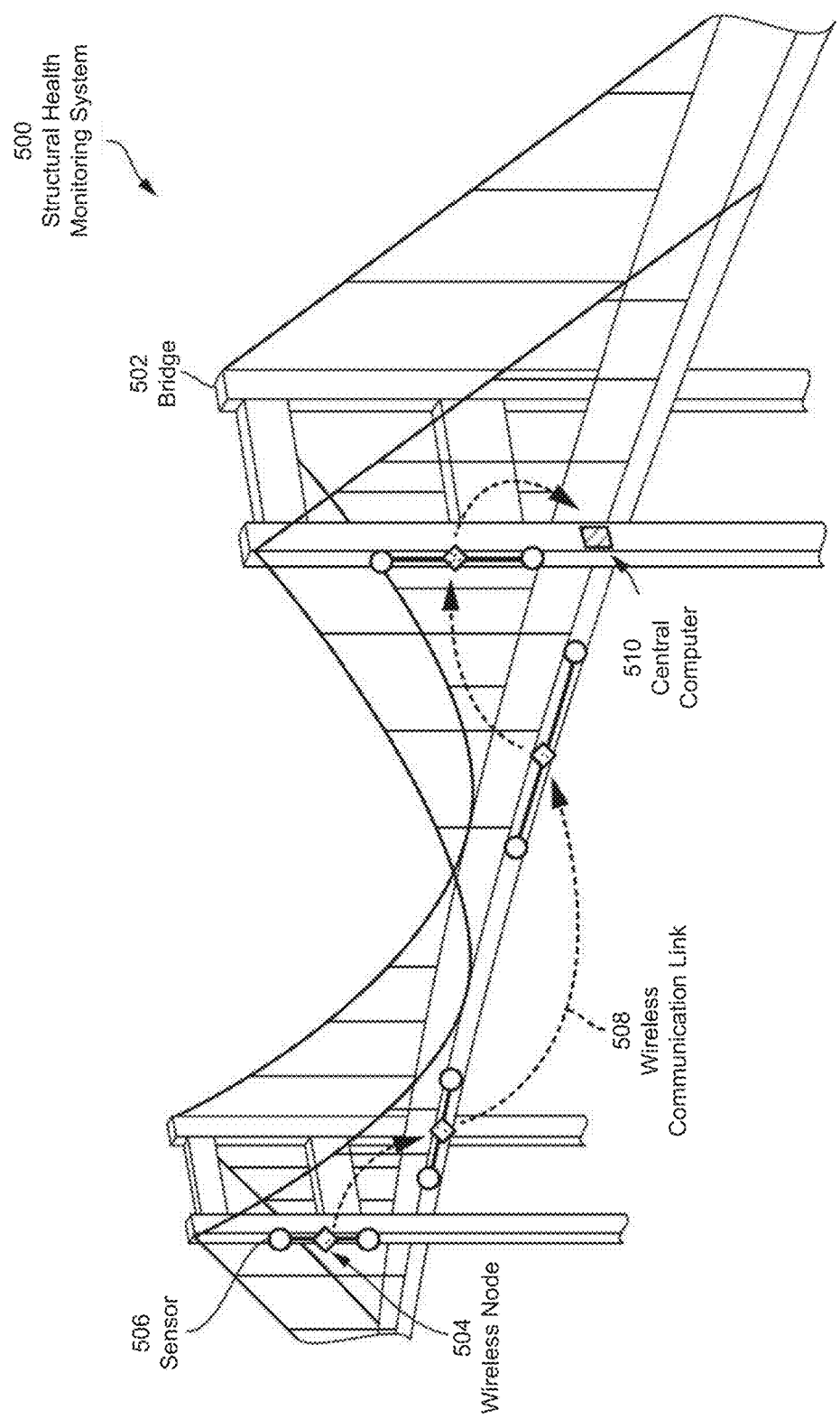
FIG. 5 is diagram showing an example structural health monitoring system deployed on a bridge, according to some embodiments.

As discussed above, the power regulation systems disclosed herein may be integrated into a wireless node that may be deployed in any of a variety of operating environments, such as in industrial monitoring settings. For example, multiple wireless nodes may be deployed in a structural health monitoring system that is configured to monitor the health of a structure, such as a bridge or a building. An example of such a structural health monitoring system is shown in FIG. 5 by structural health monitoring system 500. As shown, the structural health monitoring system 500 is deployed on a bridge 502 and includes multiple wireless nodes 504 that gather sensor information from sensors 506 and communicate the sensor information to a central computer 510 via wireless communication links 508.

The sensors 506 may be configured to measure one or more parameters of the bridge 502. For example, the sensors 506 may be multi-axis accelerometers to measure the movement of various sections of the bridge 502 and/or strain gauges to measure the expansion or contraction of various sections of the bridge 502. The sensors 506 may be similar (or the same) as the sensors 210 described above with reference to FIG. 2.

The wireless nodes 504 may be configured to gather sensor information from sensors 506 and wirelessly communicate the sensor information to the central computer 510. For example, the wireless nodes 504 may provide the sensor information to the central computer 510 by wireless communication links 508. The wireless nodes 504 may directly communicate with the central computer 510 or communicate with a nearby wireless node 504 that, in turn, passes on the received sensor information to the central computer 510 as shown in FIG. 5. In some embodiments, the wireless nodes 504 may be batteryless wireless nodes that are powered by energy harvesters. For example, the wireless nodes 504 may be any of wireless nodes 200, 300A, and 300B described above.

The central computer 510 may receive and process the information from the wireless nodes 504. For example, the central computer 510 may compile the received information and identify the health of the bridge 502 based on the compiled information. In another example, the central computer 510 may compile the received information and send the compiled information to another computer system for further analysis. In some embodiments, the central computer 510 may be placed in location that is close to power and/or communication cables. Thereby, the central computer 510 may receive power from the power grid and transmit sensor information to external computer systems via communication cables.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

What is claimed is:

1. A wireless node comprising:
   a sensor configured to generate information indicative of at least one parameter;
   a wireless transmitter coupled to the sensor and configured to wirelessly transmit the information indicative of the at least one parameter;
   a plurality of energy harvesters including a first energy harvester;
   a first regulator coupled to the first energy harvester and configured to receive power from the first energy harvester; and
   a second regulator coupled to the plurality of energy harvesters and the first regulator, the second regulator being configured to selectively receive power from the first regulator and at least one of the plurality of energy harvesters and provide power to the wireless transmitter.

2. The wireless node of claim 1, wherein the first energy harvester is configured to harvest energy from a first source selected from the group consisting of: air currents, light, and heat and wherein the plurality of energy harvesters further includes a second energy harvester configured to harvest energy from a second source different than the first source.

3. The wireless node of claim 1, wherein the wireless node is a batteryless wireless node.

4. The wireless node of claim 1, wherein the second regulator is configured to increase a voltage from the at least one energy harvester to generate a supply voltage and provide the supply voltage to the wireless transmitter.

5. The wireless node of claim 1, further comprising a plurality of load switches configured to selectively couple each of the plurality of energy harvesters to the second regulator.

6. The wireless node of claim 5, further comprising a plurality of power monitors, including a first power monitor configured to measure an output power of the first energy harvester.

7. The wireless node of claim 6, further comprising a controller coupled to the plurality of load switches and the plurality of power monitors, the controller being configured to identify an energy harvester from the plurality of energy harvesters with a highest output power and control the plurality of switches to couple the identified energy harvester to the second regulator and decouple a remainder of the plurality of energy harvesters from the second regulator.

8. The wireless node of claim 1, further comprising a supercapacitor coupled to the second regulator, and wherein the second regulator is further configured to store energy from the at least one energy harvester in the supercapacitor.

9. A power regulator system comprising:
   a plurality of power ports configured to couple to a plurality of energy harvesters, the plurality of power ports including a first power port configured to couple to a first energy harvester of the plurality of energy harvesters;
   a first regulator coupled to the first power port and configured to receive power from the first energy harvester; and
   a second regulator coupled to the first regulator and the plurality of power ports, the second regulator being configured to selectively receive power from the first regulator and at least one of the plurality of energy harvesters and provide power to a load.

10. The system of claim 9, wherein the first regulator is configured to increase a voltage of the power received from the first energy harvester to generate a regulated voltage and provide the regulated voltage to the second regulator.

11. The system of claim 9, wherein the second regulator is configured to increase a voltage of the power received from the at least one energy harvester to generate a supply voltage and provide the supply voltage to the load.

12. The system of claim 9, further comprising a plurality of load switches configured to selectively couple each of the plurality of power ports to the second regulator.

13. The system of claim 12, further comprising a plurality of power monitors, including a first power monitor configured to measure an output power of the first energy harvester.

14. The system of claim 13, further comprising a controller coupled to the plurality of load switches and the plurality of power monitors, the controller being configured identify a power port associated with an energy harvester with a highest output and control the plurality of switches to couple the identified power port to the second regulator and decouple a remainder of the plurality of power ports from the second regulator.

15. The system of claim 9, further comprising a supercapacitor coupled to the second regulator and wherein the second regulator is further configured to store energy from the at least one energy harvester in the supercapacitor.

16. A method of operating a wireless node comprising:
   receiving power from a first energy harvester of a plurality of energy harvesters;
   providing, by a first regulator, the power from the first energy harvester to a controller via a second regulator;

measuring an output power of each of the plurality of energy harvesters;

identifying, by the controller, an energy harvester from the plurality of energy harvesters to power the controller based on the output power of each of the plurality of energy harvesters; and controlling, by the controller, a plurality of switches to couple the identified energy harvester to the second regulator and decouple a remainder of the energy harvesters from the second regulator.

17. The method of claim 16, wherein identifying the energy harvester to power the controller includes identifying the energy harvester with a highest output power.

18. The method of claim 16, further comprising regulating, by the first regulator, a voltage of the power received from the first energy harvester and wherein providing the power from the first energy harvester to the controller via the second regulator includes providing the regulated voltage to the second regulator.

19. The method of claim 16, further comprising providing, by the second regulator, power from the identified energy harvester to the controller.

20. The method of claim 19, further comprising regulating, by the second regulator, a voltage received from the identified energy harvester and wherein providing the power from the identified energy harvester to the controller includes providing the regulated voltage to the controller.

* * * * *